(12) United States Patent
Chang Chien et al.

(10) Patent No.: US 10,593,647 B2
(45) Date of Patent: Mar. 17, 2020

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/019,551

(22) Filed: Jun. 27, 2018

(65) Prior Publication Data

US 2020/0006290 A1    Jan. 2, 2020

(51) Int. Cl.
*H01L 23/48* (2006.01)
*H01L 25/065* (2006.01)
(Continued)

(52) U.S. Cl.
CPC ...... *H01L 25/0657* (2013.01); *H01L 21/4857* (2013.01); *H01L 23/3121* (2013.01);
(Continued)

(58) Field of Classification Search
CPC ........... H01L 25/0657; H01L 23/49827; H01L 23/49816; H01L 2224/16227; H01L 2224/48227; H01L 2225/06572
USPC .................................. 257/737, 686
See application file for complete search history.

(56) References Cited

U.S. PATENT DOCUMENTS 8,217,502 B2 *   7/2012   Ko ................... H01L 23/49833
                                                257/686
8,536,695 B2 *   9/2013   Liu ....................... H01L 23/13
                                                174/255
(Continued)

FOREIGN PATENT DOCUMENTS

TW          201714263        4/2017
TW          201717343        5/2017
(Continued)

OTHER PUBLICATIONS

"Office Action of Taiwan Counterpart Application," dated May 17, 2019, p. 1-p. 6.

*Primary Examiner* — Nitin Parekh
(74) *Attorney, Agent, or Firm* — JCIPRNET

(57) ABSTRACT

A package structure including first and second packages is provided. The first package includes a semiconductor die, an insulating encapsulant, a first redistribution layer, a second redistribution layer, and a plurality of conductive wire segments. The semiconductor die has an active surface and a back surface. The insulating encapsulant encapsulates the semiconductor die. The first redistribution layer is disposed on the back surface of the semiconductor die and a bottom surface of the insulating encapsulant. The first redistribution layer has a first surface and a second surface opposite to the first surface. The second redistribution layer is disposed on the active surface of the semiconductor die. The plurality of conductive wire segments electrically connects the semiconductor die to the second redistribution layer and the first redistribution layer to the second redistribution layer. The second package is stacked on the second surface of the first redistribution layer over the first package.

9 Claims, 17 Drawing Sheets

(51) Int. Cl.
  *H01L 23/498* (2006.01)
  *H01L 23/00* (2006.01)
  *H01L 21/48* (2006.01)
  *H01L 25/00* (2006.01)
  *H01L 23/31* (2006.01)

(52) U.S. Cl.
  CPC .. *H01L 23/49816* (2013.01); *H01L 23/49822* (2013.01); *H01L 23/49827* (2013.01); *H01L 24/16* (2013.01); *H01L 24/32* (2013.01); *H01L 24/48* (2013.01); *H01L 25/50* (2013.01); *H01L 2224/16227* (2013.01); *H01L 2224/32225* (2013.01); *H01L 2224/48227* (2013.01); *H01L 2224/48464* (2013.01); *H01L 2225/06572* (2013.01)

(56) References Cited

U.S. PATENT DOCUMENTS

| | | | | |
|---|---|---|---|---|
| 8,836,136 | B2* | 9/2014 | Chau | H01L 23/49517 257/774 |
| 9,356,006 | B2* | 5/2016 | Haba | H01L 25/105 |
| 2010/0109138 | A1* | 5/2010 | Cho | H01L 25/0657 257/686 |
| 2012/0168917 | A1* | 7/2012 | Yim | H01L 23/481 257/666 |
| 2012/0196406 | A1 | 8/2012 | Pendse | |
| 2012/0280386 | A1* | 11/2012 | Sato | H01L 23/3121 257/737 |
| 2014/0175671 | A1* | 6/2014 | Haba | H01L 23/528 257/777 |
| 2014/0374902 | A1* | 12/2014 | Lee | H01L 23/36 257/738 |
| 2015/0348928 | A1* | 12/2015 | Co | H01L 24/17 257/712 |
| 2016/0329272 | A1 | 11/2016 | Geissler et al. | |
| 2017/0117260 | A1 | 4/2017 | Prabhu et al. | |
| 2018/0240773 | A1* | 8/2018 | Delacruz | H01L 23/3121 |

FOREIGN PATENT DOCUMENTS

TW   I607531    12/2017
TW   I613772    2/2018

\* cited by examiner

PACKAGE STRUCTURE AND MANUFACTURING METHOD THEREOF

BACKGROUND

Technical Field

The present invention generally relates to a package structure and a manufacturing method thereof, and more particularly, to a package-on-package (PoP) structure and a manufacturing method thereof.

Description of Related Art

Electronic products that are lighter, slimmer, shorter, and smaller than their previous generation counterparts are highly sought on the market. Therefore, extensive research is performed to find new technologies for semiconductor packaging that help reduce the volume and the weight of existing devices, for example by increasing the integration of the components. 3D stacking technologies such as package-on-package have been developed to meet the requirements of higher packaging densities.

SUMMARY

The disclosure provides a package structure that adopt wire bonding for providing vertical connection. The package structure may be realized with lower manufacturing costs.

The disclosure provides a package structure including a first package and a second package. The first package includes a semiconductor die, an insulating encapsulant, a first redistribution layer, a second redistribution layer, and a plurality of conductive wire segments. The semiconductor die has an active surface and a back surface. The insulating encapsulant encapsulates the semiconductor die. The first redistribution layer is disposed on the back surface of the semiconductor die and a bottom surface of the insulating encapsulant. The first redistribution layer has a first surface and a second surface opposite to the first surface. The second redistribution layer is disposed on the active surface of the semiconductor die. The plurality of conductive wire segments electrically connects the semiconductor die to the second redistribution layer and the first redistribution layer to the second redistribution layer. The second package is stacked on the second surface of the first redistribution layer over the first package.

The disclosure provides a method of fabricating a package structure. The method includes at least the following steps. A carrier is provided. A first package is formed on the carrier. The first package is formed by at least the following steps. A first redistribution layer is formed on the carrier, wherein the first redistribution layer has a first surface and a second surface opposite to the first surface. A semiconductor die is bonded on the first surface of the first redistribution layer. The semiconductor die is electrically connected to the first redistribution layer through a plurality of conductive wires. An insulating material is formed to encapsulate the semiconductor die and the plurality of conductive wires. A thinning process is performed to obtain an insulating encapsulant by reducing a thickness of the insulating material until a portion of each of the conductive wires is removed to form a plurality of conductive wire segments, wherein the semiconductor die is electrically insulated from the first redistribution layer after the thinning process. A second redistribution layer is formed on a top surface of the insulating encapsulant, and over the semiconductor die. The second redistribution layer is electrically connected to the first redistribution layer and to the semiconductor die by the plurality of conductive wire segments.

Based on the above, the package structure of the disclosure is formed with a plurality of conductive wire segments, wherein the conductive wire segments electrically connect the semiconductor die to the second redistribution layer, and electrically connect the first redistribution layer to the second redistribution layer. As such, the wire segments (formed through wire bonding) may be used to replace copper pillars/posts, copper bumps or through insulator vias (TIV) used in conventional package structures to provide vertical connection between the redistribution layers and to the semiconductor die. Overall, the simplicity of the manufacturing process of the package structure may be realized, thereby reducing the manufacturing cost.

To make the aforementioned more comprehensible, several embodiments accompanied with drawings are described in detail as follows.

BRIEF DESCRIPTION OF THE DRAWINGS

The accompanying drawings are included to provide further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
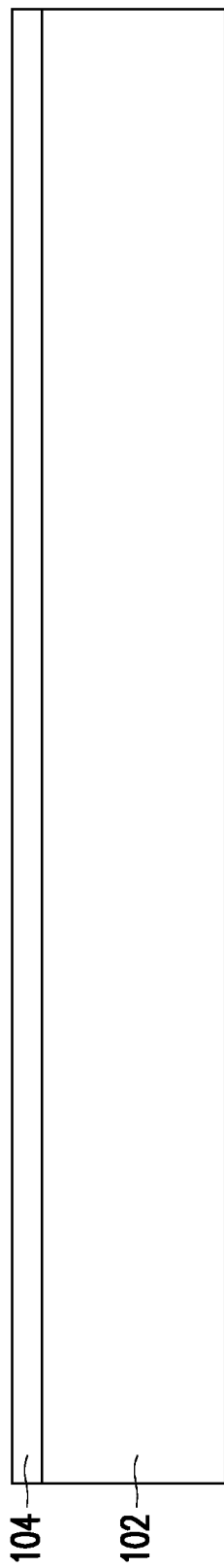
FIGS. 1A-1O are schematic cross-sectional views of various stages in a method of fabricating a package structure according to an embodiment of the present disclosure.

Reference will now be made in detail to some embodiments of the present disclosure, examples of which are illustrated in the accompanying drawings. Wherever possible, the same reference numbers are used in the drawings and the description to refer to the same or like parts.

FIGS. 1A-1O are schematic cross-sectional views of various stages in a method of fabricating a package structure according to an embodiment of the present invention. Referring to FIG. 1A, a first carrier 102 is provided. In one embodiment, the first carrier 102 may be made of silicon, polymer, or other suitable materials. In some other embodiments, the first carrier 102 may be a glass substrate or a glass supporting board. Other suitable substrate material may be adapted as the first carrier 102 as long as the material is able to withstand the subsequent processes while carrying the package structure formed thereon.

A first release layer 104 may be formed on the first carrier 102 to enhance the adhesion between the first carrier 102 and the other structures subsequently formed thereon, and to improve the rigidity of the overall package structure during the manufacturing process. The first release layer 104 may be a light to heat conversion (LTHC) adhesive layer, but the disclosure is not limited thereto. Other suitable materials may be used depending on requirement.

Figure 1B:
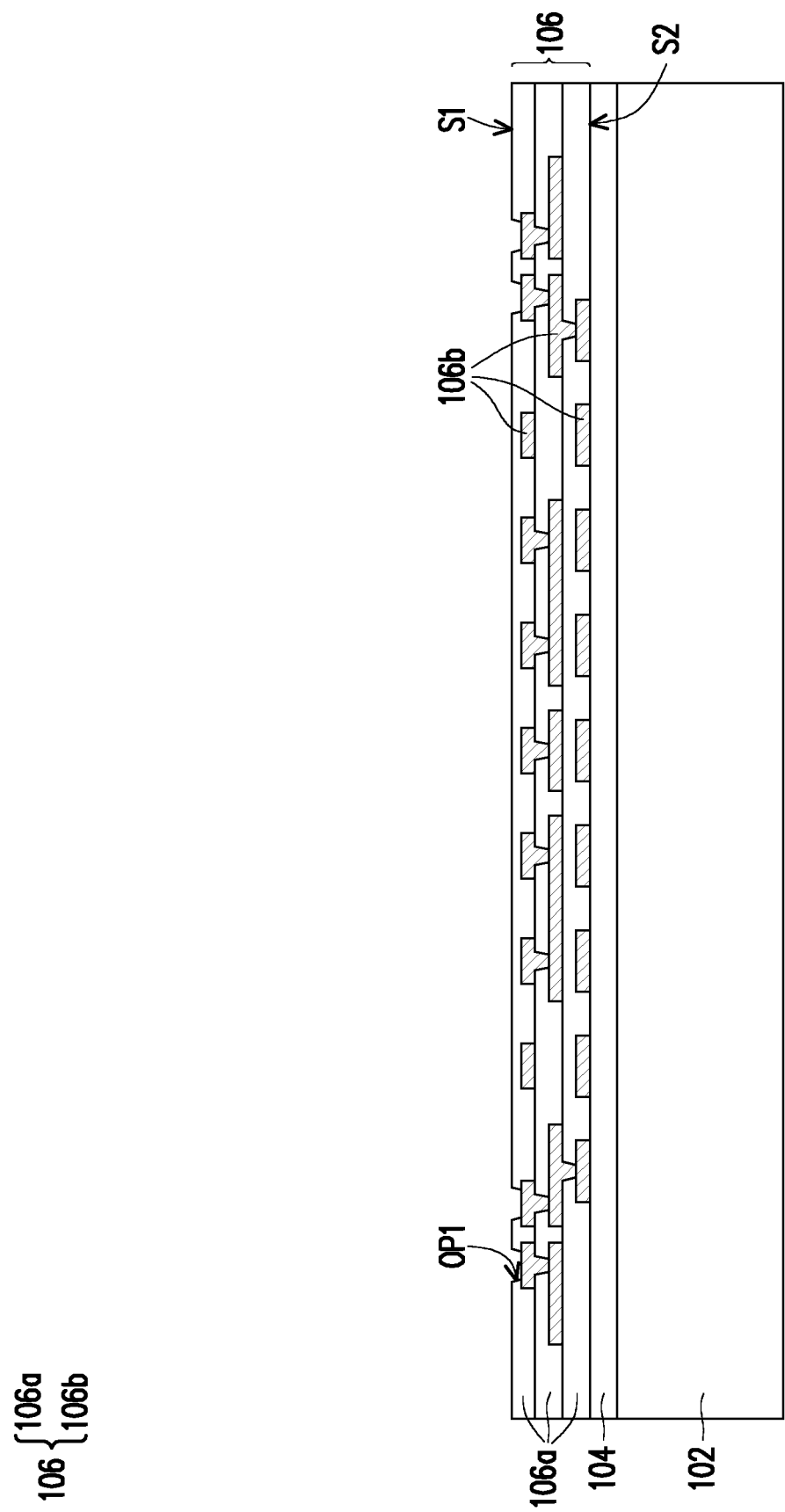

Referring to FIG. 1B, a first redistribution layer 106 may be formed on the first carrier 102 and on the first release layer 104. The first redistribution layer 106 may include a plurality of dielectric layers 106a and a plurality of conductive elements 106b alternately formed. The plurality of dielectric layers 106a may be made of non-organic or organic dielectric materials such as silicon oxide, silicon nitride, silicon carbide, silicon oxynitride, polyimide, benzocyclobutene (BCB), or the like, but the disclosure is not limited thereto. The plurality of conductive elements 106b may be made of copper, aluminum, nickel, or other suitable conductive materials, but the disclosure is not limited thereto. In some embodiments, the first redistribution layer 106 may be formed by the following steps. For example, in the illustrated embodiment, a conductive material (not shown) may be deposited on the first carrier 102 by sputtering, evaporation, or electroplating. Patterning of the conductive material through lithography and etching may form a first group of conductive elements 106b on the first carrier 102. Subsequently, a first dielectric layer 106a may be formed on the conductive elements 106b through a sequence of deposition, lithography, and etching. The sequence may then be repeated to form the desired number of dielectric layers 106a and conductive elements 106b. In some alternative embodiments, the order of formation of the conductive elements 106b and the dielectric layer 106a may be inverted, according to the design requirements.

Furthermore, as shown in FIG. 1B, the first redistribution layer 106 has a first surface S1 and a second surface S2 opposite to the first surface S1. In the exemplary embodiment, a plurality of openings OP1 is located on the first surface S1 of the redistribution layer 106, and the second surface S2 of the first redistribution layer 106 is in contact with the first release layer 104. The plurality of openings OP1 may expose a portion of the conductive elements 106b for future electrical connection to other components of the package.

Figure 1C:
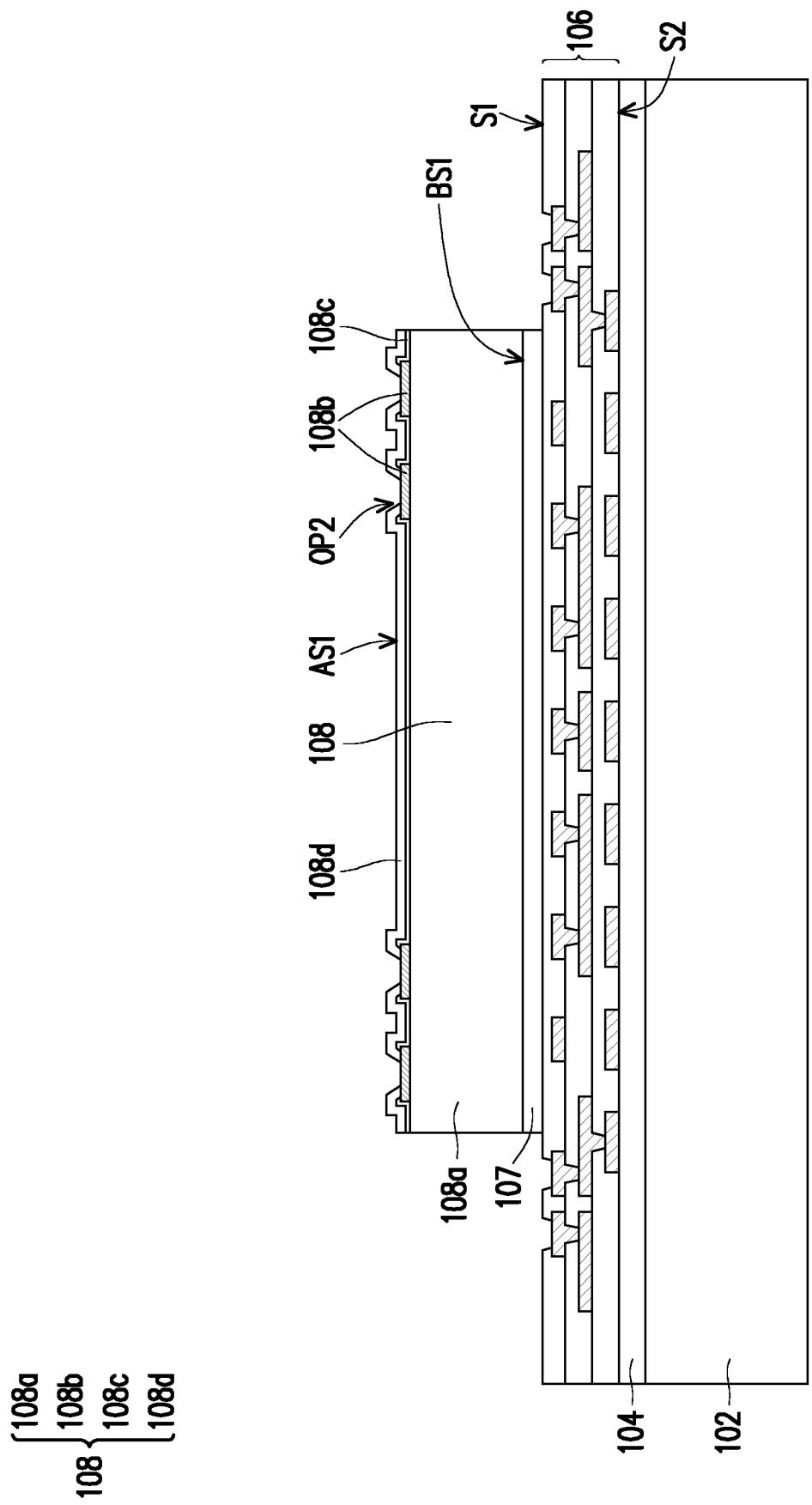

Referring to FIG. 1C, after foiling the first redistribution layer 106, a semiconductor die 108 is disposed on the first surface S1 of the first redistribution layer 106. For example, the semiconductor die 108 may be attached to the first redistribution layer 106 through an adhesive layer 107. The adhesive layer 107 may be a die attach film or formed from adhesive materials including epoxy resins, inorganic materials, organic polymeric materials, or the like, but the disclosure is not limited thereto.

The semiconductor die 108 may be an ASIC (Application-Specific Integrated Circuit). In some embodiments, the semiconductor die 108 may be used to perform logic applications. The nature or type of the semiconductor die 108 construe no limitation in the present disclosure. Other suitable semiconductor devices may also be utilized as the semiconductor die 108. The semiconductor die 108 may include a semiconductor substrate 108a, a plurality of contact pads 108b, a passivation layer 108c, and, optionally, a post-passivation layer 108d. The plurality of contact pads 108b is disposed on the semiconductor substrate 108a. The passivation layer 108c is disposed on the semiconductor substrate 108a and has openings that partially expose the contact pads 108b on the semiconductor substrate 108a. The post-passivation layer 108d covers the passivation layer 108c and has a plurality of openings OP2 that expose at least a portion of the contact pad 108b. As illustrated in FIG. 1C, the semiconductor die 108 may have an active surface AS1 and a back surface BS1 opposite to the active surface AS1. The plurality of contact pads 108b is located on an active surface AS1 of the semiconductor substrate 108a, while the back surface BS1 of the semiconductor substrate 108a is in contact with the adhesive layer 107. In other words, the semiconductor die 108 may be disposed on the first redistribution layer 106 in a face-up configuration.

Figure 1D:
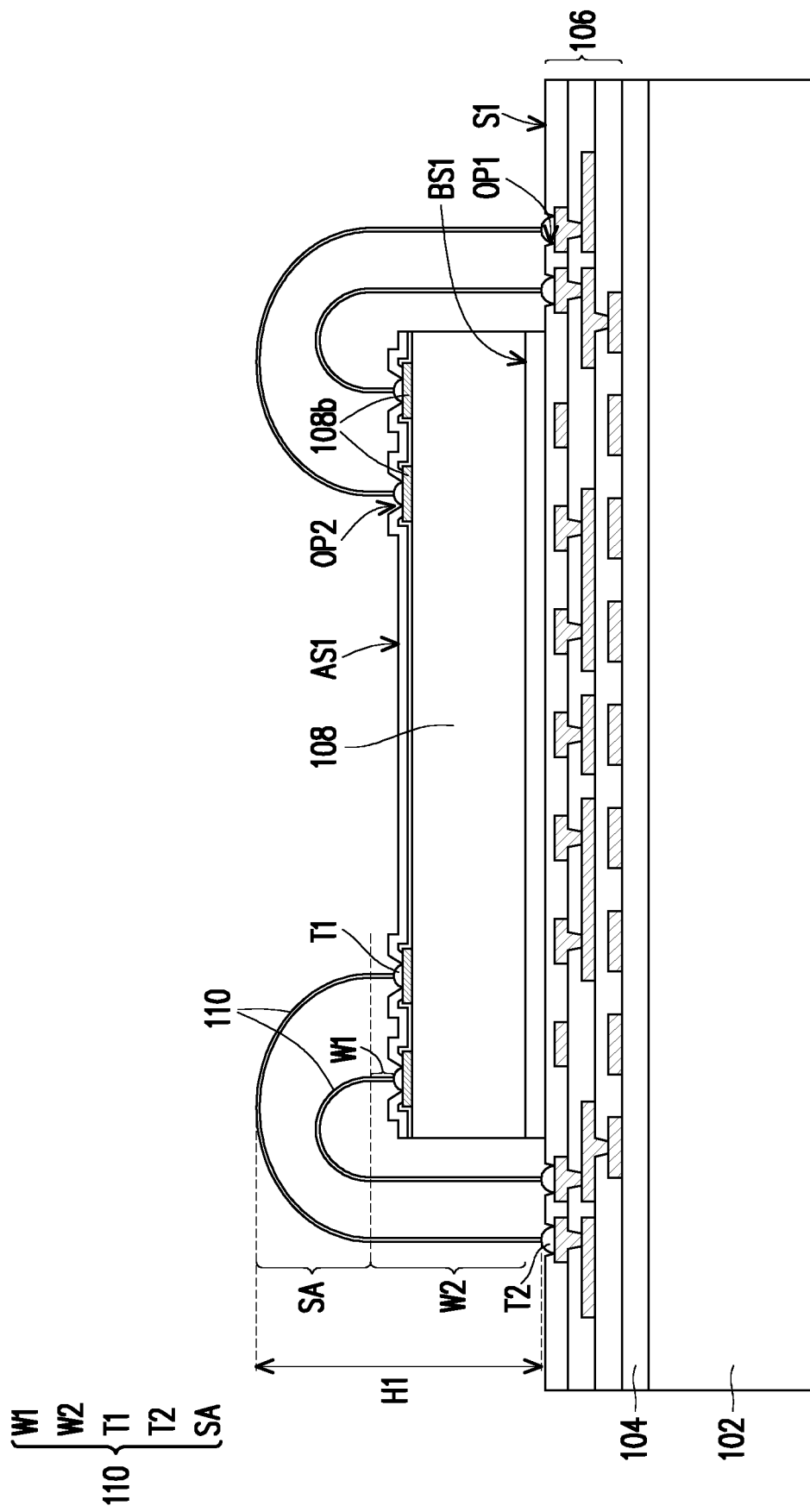

Referring to FIG. 1D, the semiconductor die 108 may be electrically connected to the first redistribution layer 106 through a plurality of conductive wires 110. The plurality of conductive wires 110 may be formed through wire bonding. First studs T1 and second studs T2 are forming at the corresponding terminals of the conductive wires 110. The first studs T1 are coupled to the semiconductor die 108. The second studs T2 are coupled to the first redistribution layer 106. The first studs T1 and the second studs T2 are electrically connected to one another through the conductive wires 110. The first studs T1 may be disposed on the contact pads 108b of the semiconductor die 108. The second studs T2 may be disposed on the exposed conductive elements 106b of the first redistribution layer 106. The first studs T1 may be correspondingly disposed in the openings OP2 on the active surface AS1 of the semiconductor die 108. The second studs T2 may be correspondingly disposed in the openings OP1 of the first redistribution layer 106.

In some embodiments, each of the conductive wires 110 may include a first segment W1, a sacrificial segment SA, and a second segment W2. Each of the first segments W1 of the conductive wires 110 may be electrically connected to a corresponding first stud T1. Each of the second segments W2 of the conductive wires 110 may be electrically connected to a corresponding second stud T2. Moreover, each of the sacrificial segments SA of the conductive wires 110 may be connecting or joining the first segments W1 to the second segments W2. In other words, each of the conductive wires 110 may include, in order, a first stud T1, a first segment W1, a sacrificial segment SA, a second segment W2, and a second stud T2.

In the exemplary embodiment, the conductive wires 110 may be formed through a wire bonder (not illustrated). The wire bonder may be a wedge bond, a ball bond, or other suitable wire bonder according to the design requirements. In some embodiments, the wire bonder may include an automated device that welds the conductive wires 110. For instance, each of the conductive wires 110 may be fed through a bonding tool such as a capillary (not illustrated) that applies heat, ultrasonic energy, pressure, or the combination thereof to bond each of the conductive wires 110 between the first redistribution layer 106 and the semiconductor die 108. In some embodiments, the first studs T1 and the second studs T2 of each of the conductive wires 110 may be formed through ball bond, wedge bond, or other suitable bond depending on the design requirement. After bonding the first stud T1 to the active surface AS1 of the semiconductor die 108, the first segment W1 coupled to the first stud T1 may be delivered out by the bonding tool of the wire bonder. For instance, the bonding tool of the wire bonder may move upwards from the semiconductor die 108 to form the first segment W1 in a vertical manner.

Next, the bonding tool may move in a direction upward away from the semiconductor die 108 and towards the first redistribution layer 106 to form the sacrificial segment SA. An arcing shape in the sacrificial segment SA of each of the conductive wires 110 may be formed. Subsequently, the bonding tool of the wire bonder may be positioned on one exposed conductive element 106b of the first redistribution layer 106, and a tail bond of each of the second segments W2 of the conductive wires 110 may be formed to bond the first redistribution layer 106. As such, the wire bonding process on the first redistribution layer 106 and the semiconductor die 108 is completed.

In some embodiments, after the wire bonding process, a height H1 of each of the conductive wires 110 may be in the range of 150 μm to 400 μm. The height H1 may correspond to a distance between the peak of the arcing shape of the sacrificial segment SA and the bottom end of the second segment W2 coupled to the first redistribution layer 106. In certain embodiments, the first segments W1 and the second segments W2 of the conductive wires 110 may present a substantially vertical profile, while the sacrificial segment SA joining the first segments W1 and the second segments W2 present an arc shape profile.

Figure 1E:
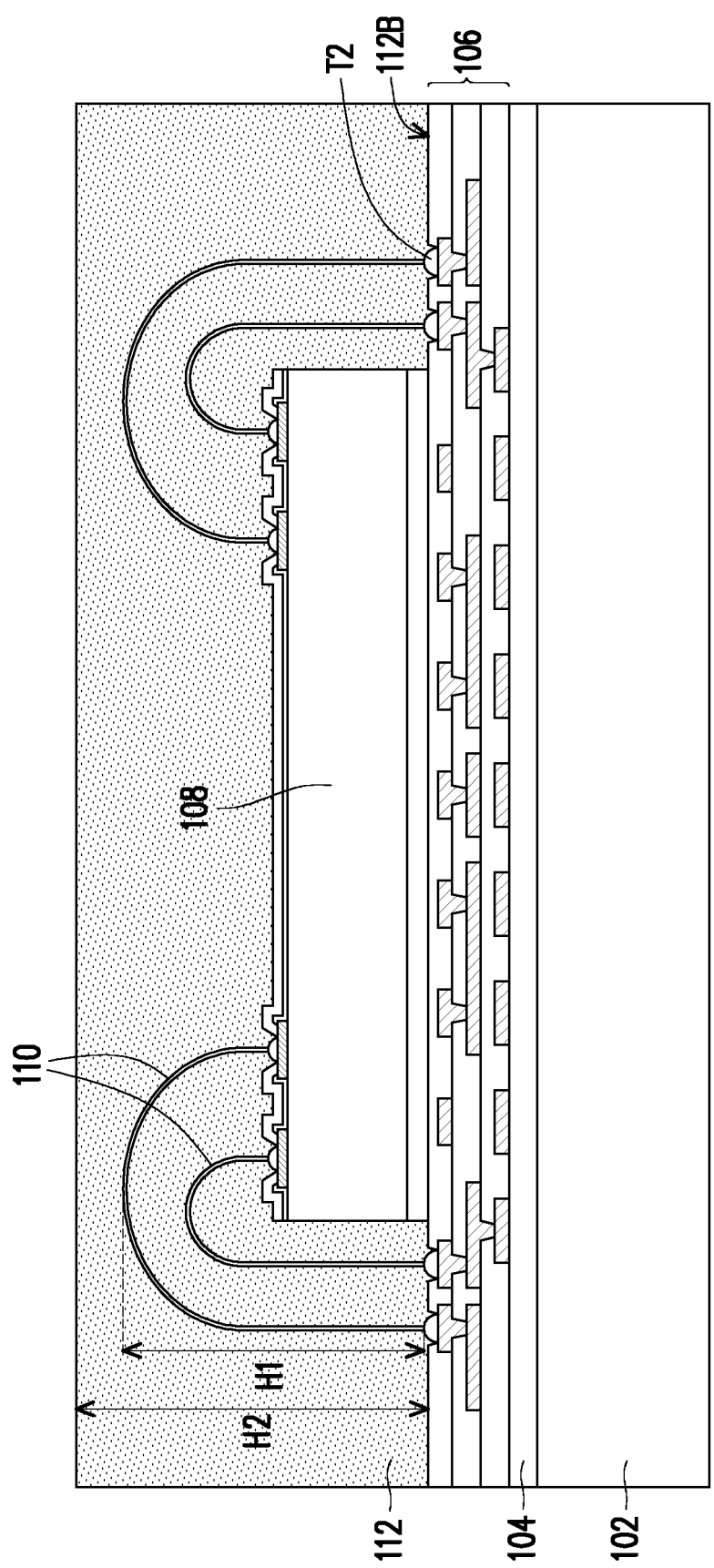

Referring to FIG. 1E, an insulating material 112 may be formed on the first redistribution layer 106 to encapsulate the semiconductor die 108 and the plurality of conductive wires 110. That is, the redistribution layer 106 may be in contact with a bottom surface 112B of the insulating material 112. In some embodiments, the lateral sides of the adhesive layer 107 may also be encapsulated by the insulating material 112. In some embodiments, the insulating material 112 further encapsulates the first studs T1 and the second studs T2. In some other embodiments, the insulating material 112 partially encapsulates the second studs T2. Furthermore, a thickness H2 of the insulating material 112 may be greater than the height H1 of each of the conductive wires 110. That is, the conductive wires 110 are not revealed and are well protected by the insulating material 112. In some embodiments, the insulating material 112 is formed through, for example, a compression molding process, filling up the gaps in between the semiconductor die 108 and the plurality of conductive wires 110. In some embodiments, the insulating material 112 includes epoxy resins or other suitable resins, but the disclosure is not limited thereto.

Figure 1F:
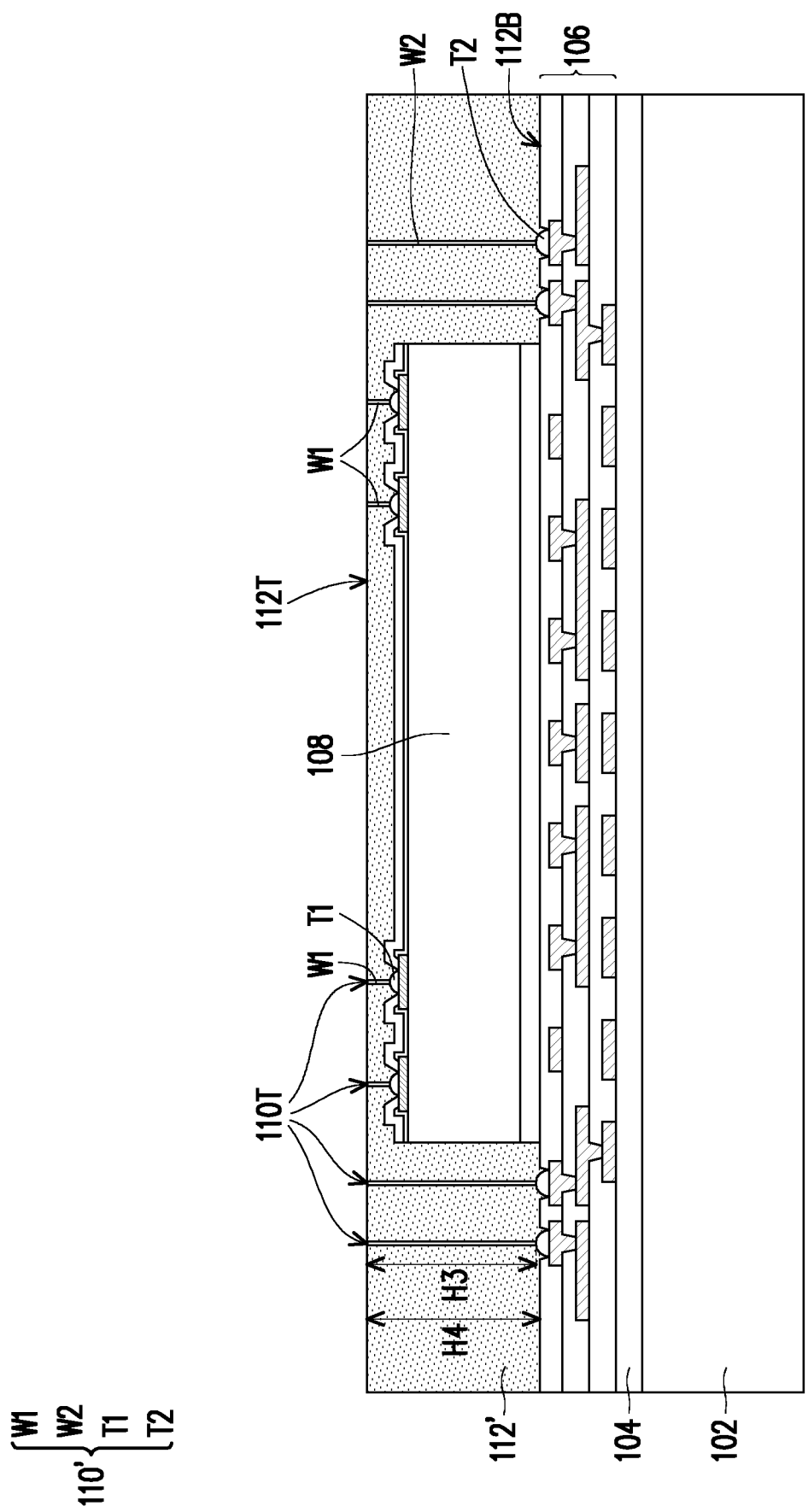

Referring to FIG. 1F, the thickness H2 of the insulating material 112 may be reduced until at least a portion of each of the conductive wires 110 is removed. For instance, the thickness H2 of the insulating material 112 (shown in FIG. 1E) may be reduced until the sacrificial segments SA of the conductive wires 110 are removed. That is, the thinning process removes the sacrificial segment SA to break the connection between the first segment W1 and the second segment W2 to form a plurality of conductive wire segments 110' and a thinned insulating encapsulant 112'. Since the sacrificial segments SA are removed during the thinning process, the electrical connection between the semiconductor die 108 and the first redistribution layer 106 is broken. Therefore, at this stage, the semiconductor die 108 is electrically insulated from the first redistribution layer 106. In certain embodiments, the thinning process may be performed using mechanical grinding, Chemical-Mechanical Polishing (CMP), etching, or other suitable methods, and this construes no limitation in the invention.

After the thinning process, a height H3 of the remaining second segments W2 may be substantially equal to the reduced thickness H4 of the insulating encapsulant 112'. In some embodiments, the height H3 of the second segments W2 may be in the range of 50 μm to 250 μm. Furthermore, terminal portions 110T may be formed after the thinning process. The terminal portions 110T are the portions of the first segments W1 and the second segments W2 exposed by the insulating encapsulant 112'. In some embodiments, the terminal portions 110T of the conductive wire segments 110' are substantially coplanar with a top surface 112T of the insulating encapsulant 112'. The top surface 112T is opposite to the bottom surface 112B of the insulating encapsulant 112' where the first redistribution layer 106 is located.

In the exemplary embodiment, the exposed portions 110T of the conductive wire segments 110' may be used for further electrical connection with other components. That is, the first segments W1 may be used to electrically connect the semiconductor die 108 to other components formed thereon, while the second segments W2 may be used to electrically connect the first redistribution layer 106 to other components formed thereon. An advantage of the proposed method is that the connecting elements (the first segments W1 and the second segments W2) of the first redistribution layer 106 and the first semiconductor die 108 are formed simultaneously, therefore, simplifying the manufacturing process and potentially reducing the fabrication costs of individual package structures.

Figure 1G:
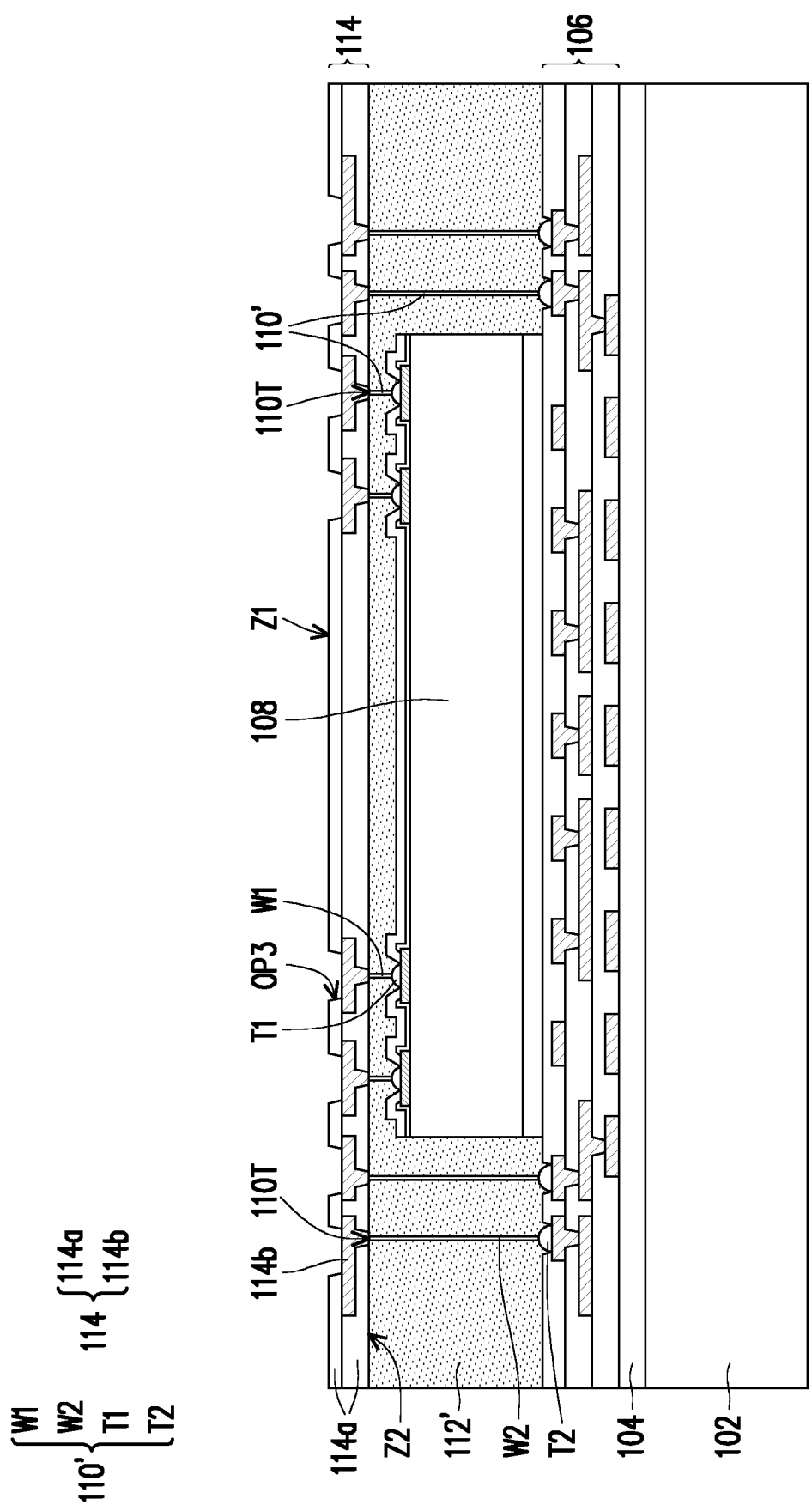

Referring to FIG. 1G, in a subsequent step, a second redistribution layer 114 may be formed on the top surface 112T of the insulating encapsulant 112'. For example, the second redistribution layer 114 may be formed by using the same methods as described for the first redistribution layer 106, hence its detailed description is omitted herein.

As shown in FIG. 1G, the second redistribution layer 114 may include a plurality of dielectric layers 114a and a plurality of conductive elements 114b embedded in the dielectric layers 114a. Furthermore, the conductive elements 114b may be electrically connected to the conductive wire segments 110' through the terminal portions 110T. That is, the conductive elements 114b may contact the conductive wire segments 110' at the terminals 110T. For example, the first segments W1 electrically connect the semiconductor die 108 to the second redistribution layer 114, and the second segments W2 electrically connect the first redistribution layer 106 to the second redistribution layer 114, wherein the second segments W2 are longer than the first segments W1. In certain embodiments, the first segments W1 have a substantially vertical profile extending from the semiconductor die 108 to the second redistribution layer 114, and the second segments W2 have a substantially vertical profile extending form the first redistribution layer 106 to the second redistribution layer 114. Additionally, the second redistribution layer 114 has a surface Z1 having a plurality of openings OP3 that expose a portion of the conductive elements 114b, and a surface Z2 that is opposite to the surface Z1.

Figure 1H:
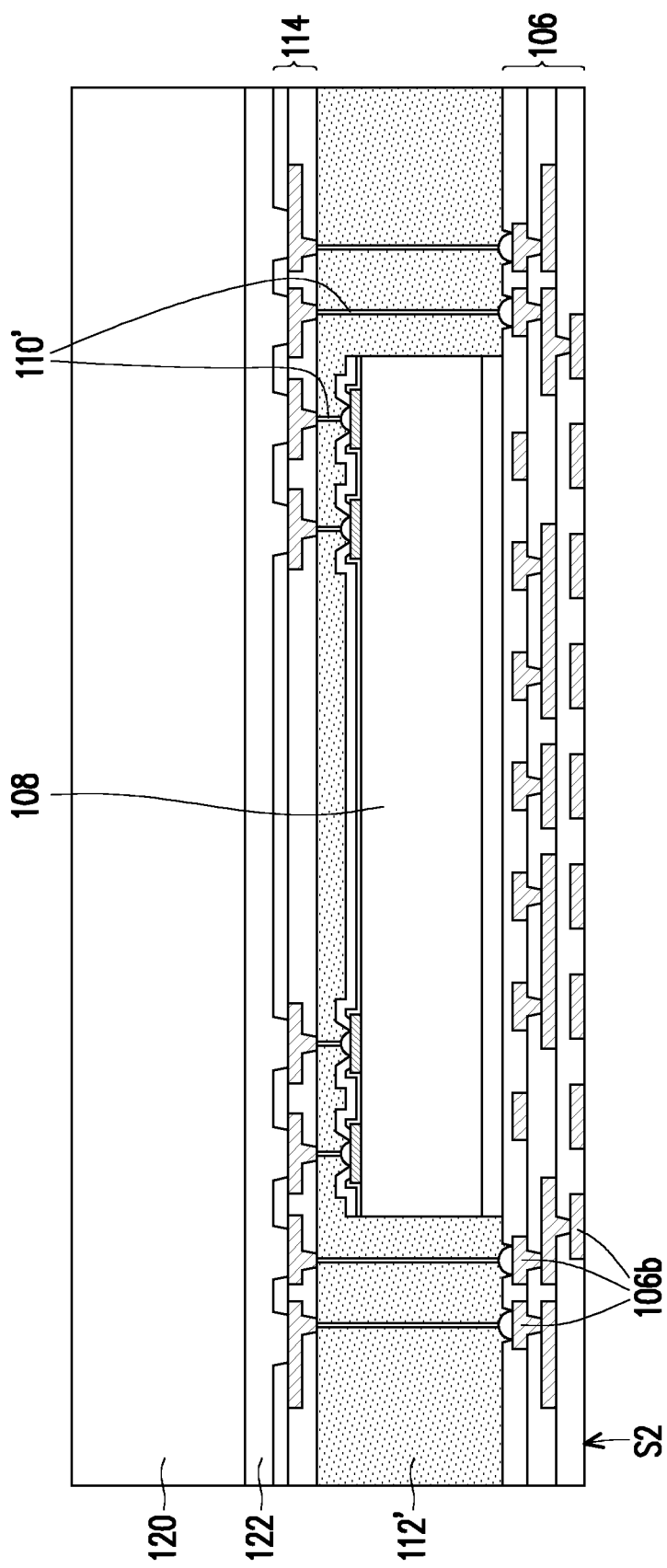

Referring to FIG. 1H, after forming the second redistribution layer 114, the package structure shown in FIG. 1G may be transferred onto a second carrier 120 through carrier transfer bonding. For example, the second carrier 120 may be attached to the surface Z1 of the second redistribution layer 114 through a second release layer 122. The second carrier 120 and the second release layer 122 may be made of the same material as the carrier 102 and the first release layer 104 described above. After the second carrier 120 is bound to the second redistribution layer 114, the first carrier 102 may be removed. In some embodiments, the first release layer 104 may be an LTHC layer, and the first carrier 102 may be peeled off following irradiation with UV light. Upon removal of the first carrier 102, the second surface S2 of the first redistribution layer 106 is exposed. Some of the conductive elements 106b of the first redistribution layer 106 are exposed at the second surface S2, so that further connection can be sorted.

Figure 1I:
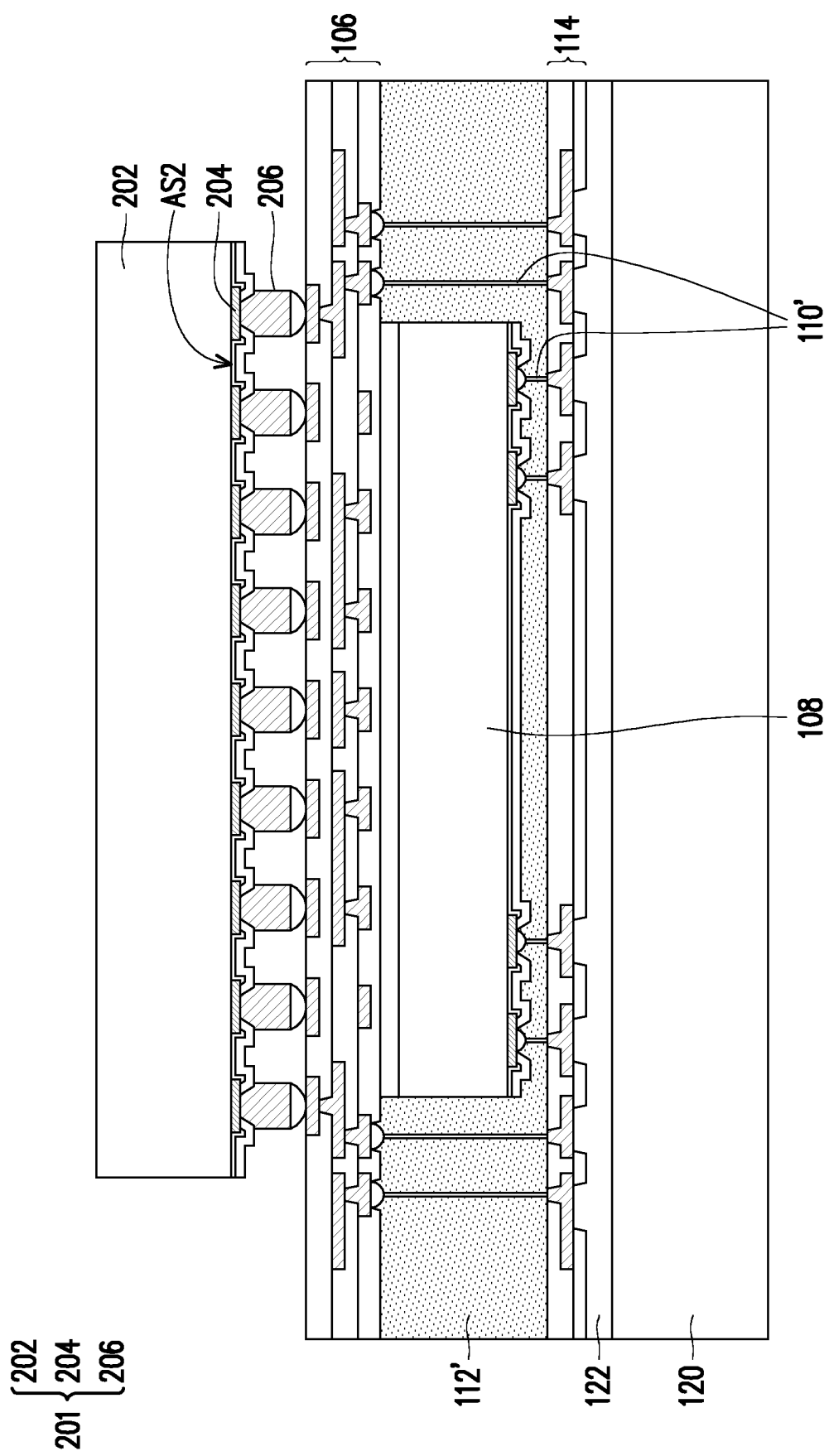

Referring to FIG. 1I, following the removal of the first carrier 102, a second semiconductor die 201 is disposed on the second surface S2 of the first redistribution layer 106. In some embodiments, the second semiconductor die 201 may be a DRAM or NAND flash memory, but the disclosure is not limited thereto. Other suitable semiconductor devices may also be utilized as the second semiconductor die 201. The second semiconductor die 201 may comprise a semiconductor substrate 202, a plurality of conductive pads 204, and a plurality of conductive bumps 206.

In the exemplary embodiment, the conductive pads 204 are located on an active surface AS2 of the second semiconductor die 201. The conductive bumps 206 are electrically connected to the plurality of conductive pads 204. The active surface AS2 of the second semiconductor die 201 may face the first redistribution layer 106. In other words, the second semiconductor die 201 may be disposed in a face-down configuration. That is, the second semiconductor die 201 is electrically connected to the first redistribution layer 106 through flip-chip bonding. Furthermore, the plurality of conductive bumps 206 may be electrically connected to the first redistribution layer 106. In some embodiments, the plurality of conductive bumps 206 may include copper, nickel, or other types of conductive bump materials. For example, the conductive bumps 206 may include a copper pillar, a tin-silver bump disposed on the copper pillar, and a nickel layer disposed between the copper pillar and the tin-silver bump, but the disclosure is not limited thereto.

Figure 1J:
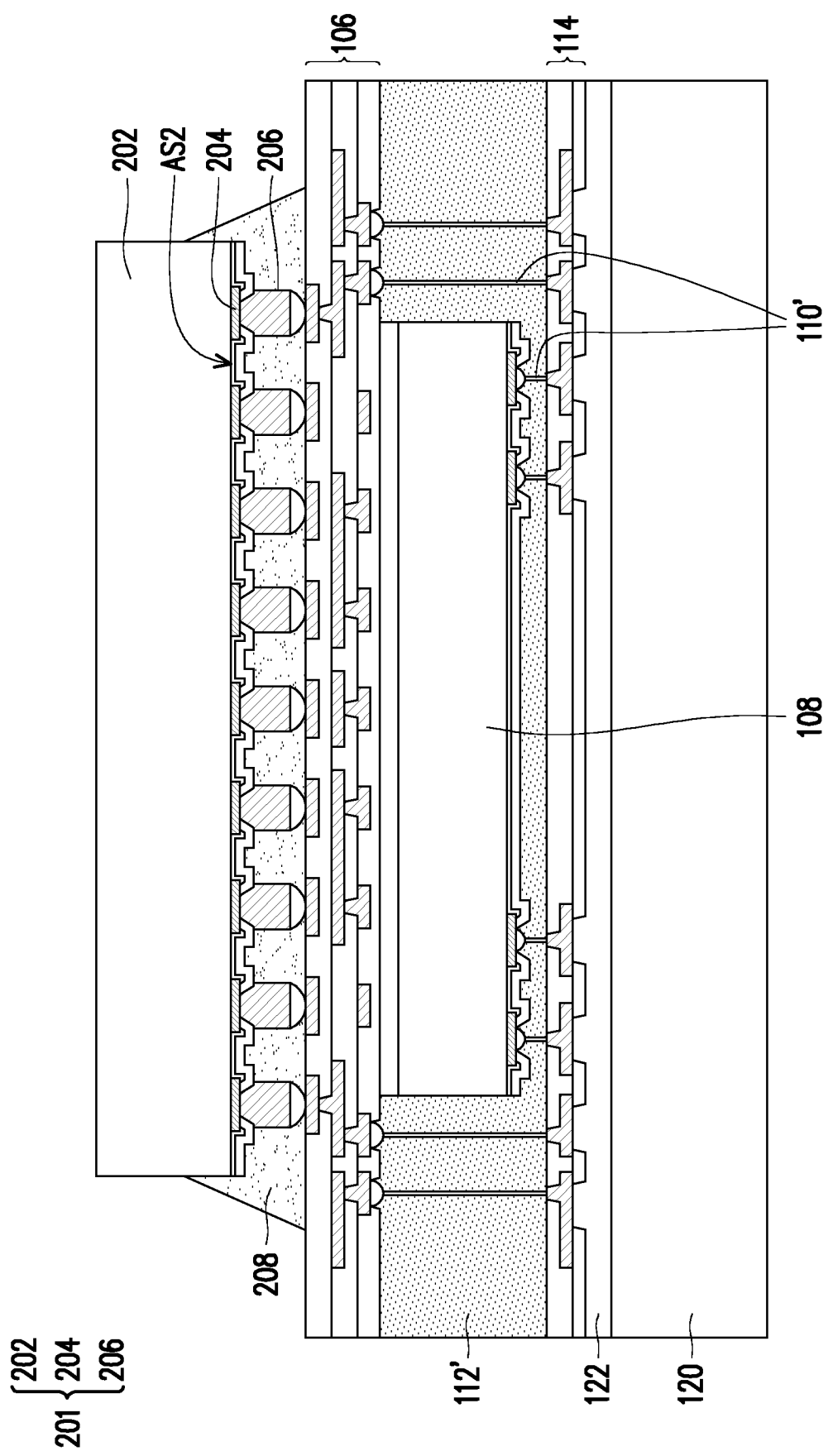

Referring to FIG. 1J, in a next step, an underfill 208 may be optionally formed to fill the spaces in between the second semiconductor die 201, the plurality of conductive bumps 206 and the first redistribution layer 106. The underfill 208 may help protect the conductive bumps 206 against thermal or physical stresses. A material for the underfill 208 may include polymeric materials or resins. In some embodiments, the underfill 208 may be a capillary underfill (CUF).

Figure 1K:
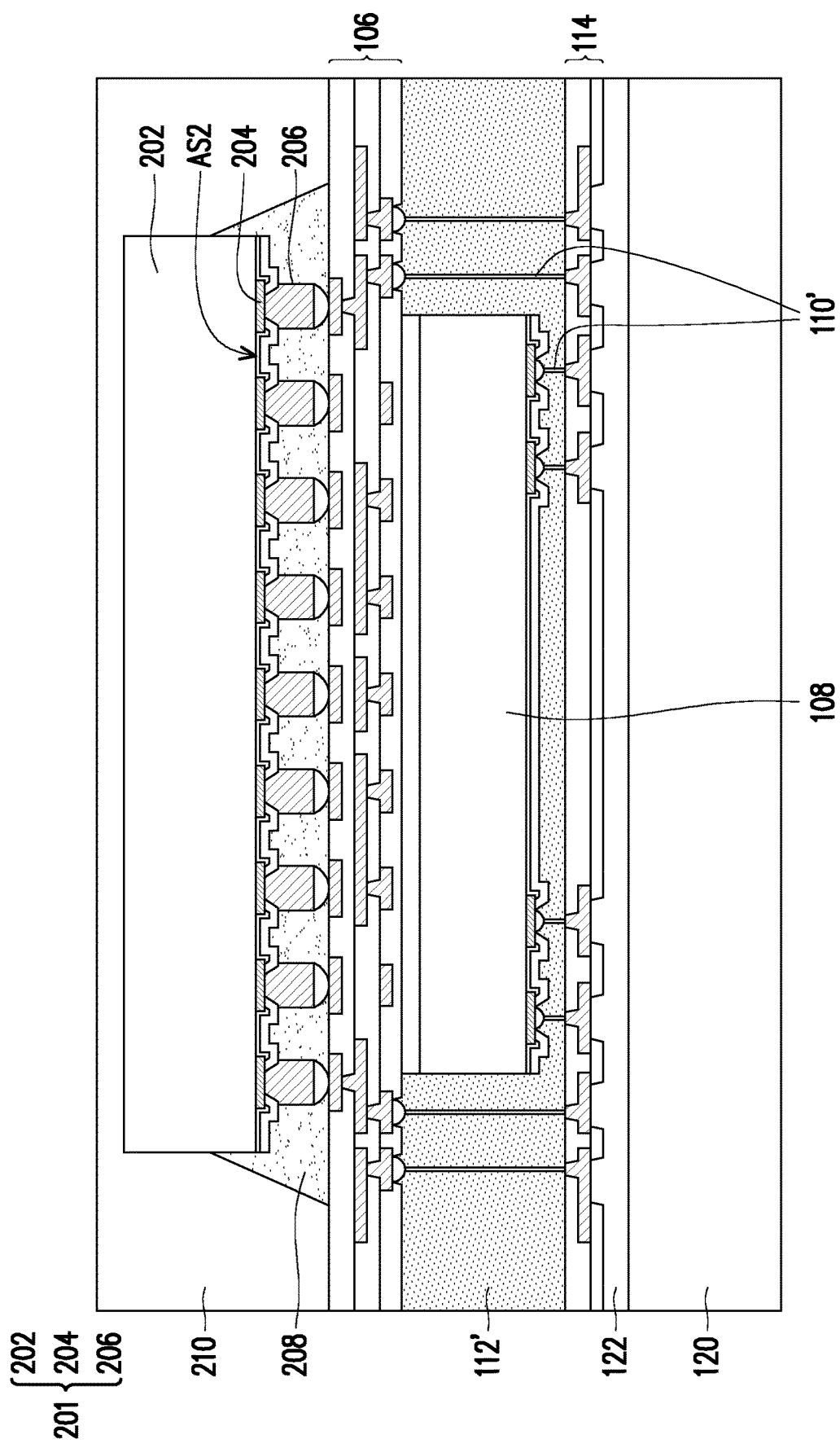

Referring to FIG. 1K, after forming the underfill 208, a second insulating encapsulant 210 may be formed over the first redistribution layer 106 encapsulating the second semiconductor die 201 and the underfill 208. The second insulating encapsulant 210 may be formed with similar material and processes as described for the first insulating encapsulant 112', but this construes no limitation in the invention.

Figure 1L:
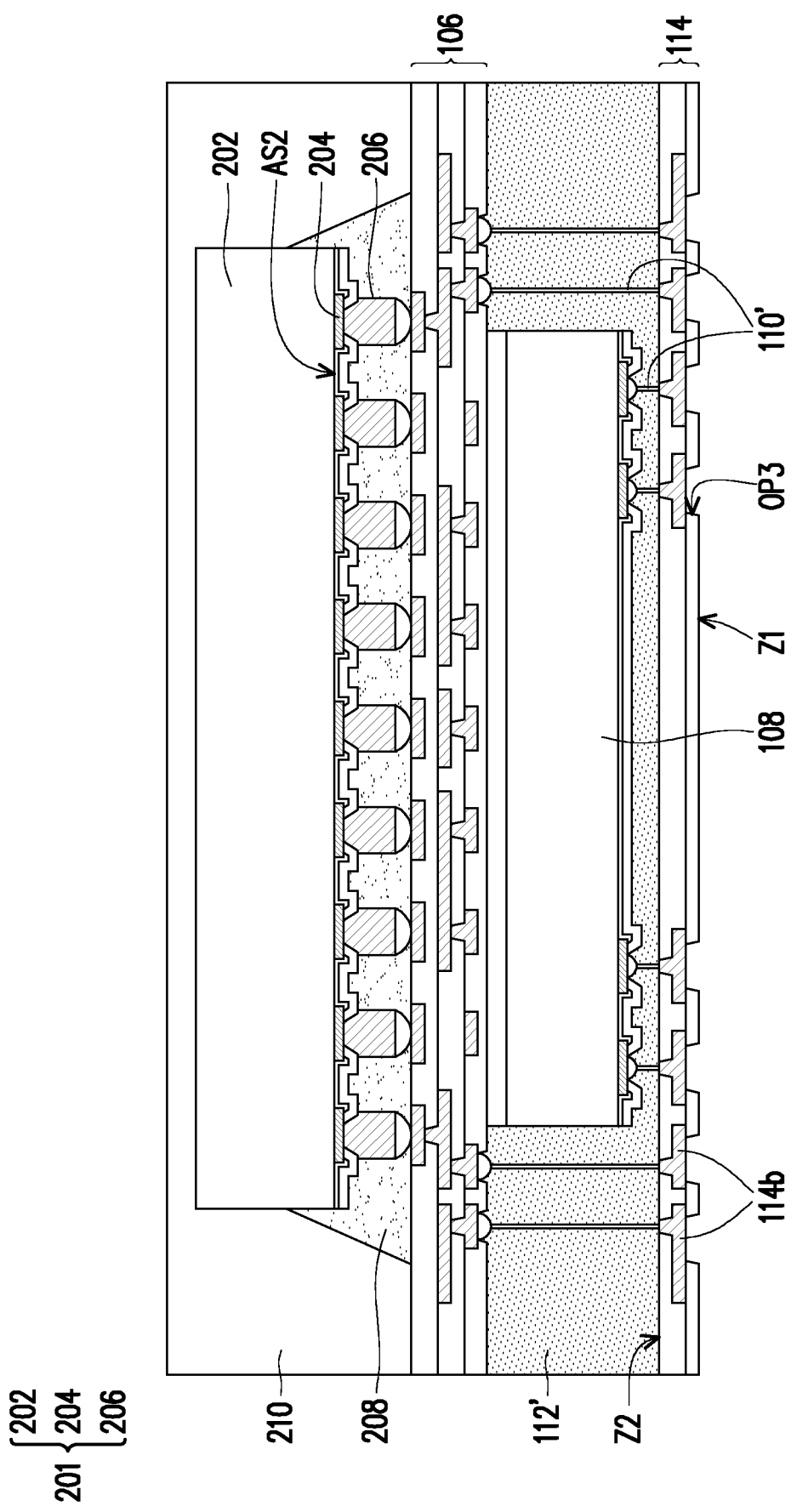

Referring to FIG. 1L, in a subsequent step, the second carrier 120 may be removed to reveal the surface Z1 of the second redistribution layer 114. For example, the second release layer 122 may be an LTHC layer, and the second carrier 120 may be peeled off following irradiation with UV light. Upon removal of the second carrier 120, openings OP3 of the second redistribution layer 114 may be revealed, thereby exposing a portion of the plurality of conductive elements 114b.

Figure 1M:
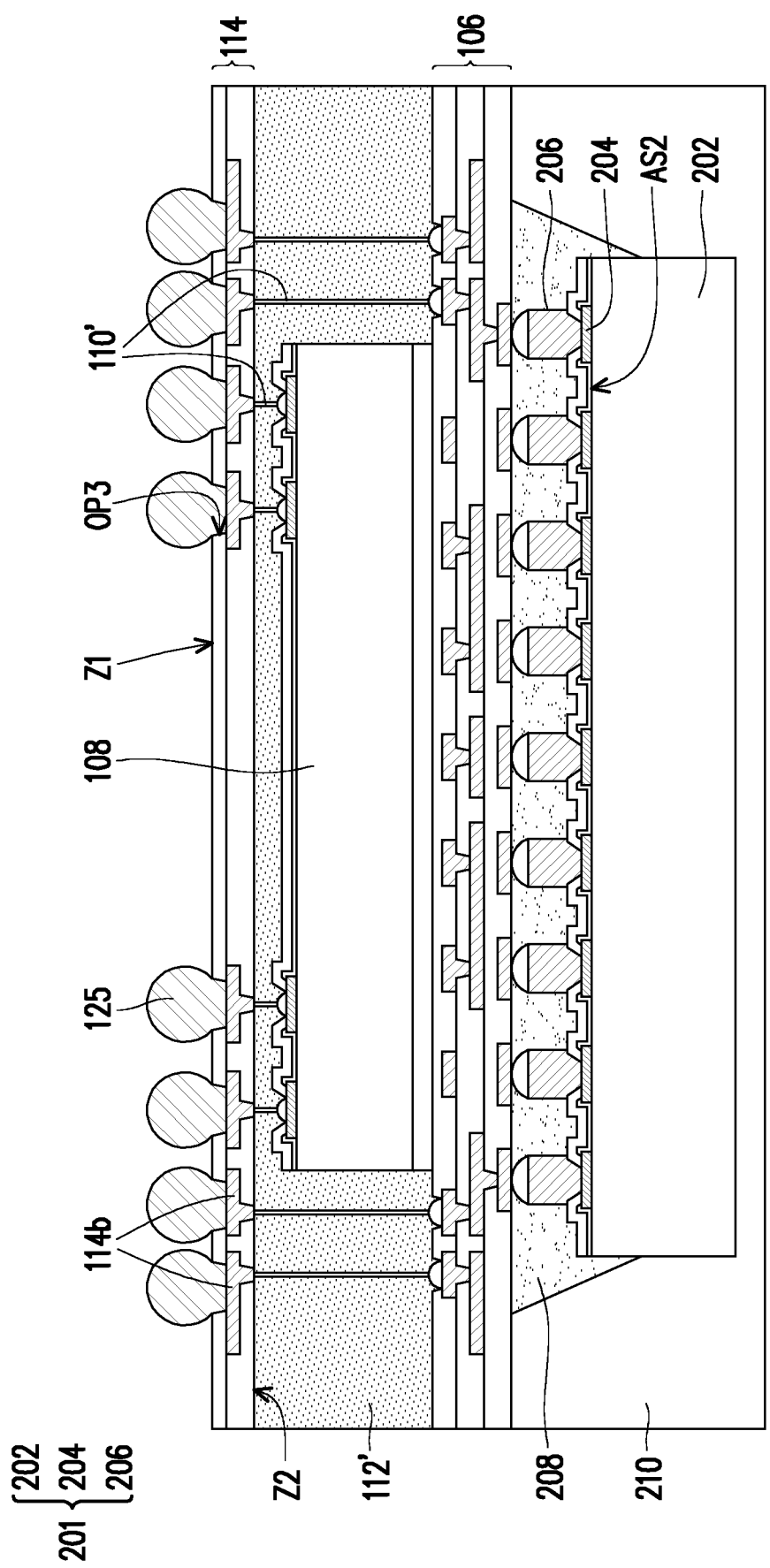

Referring to FIG. 1M, a plurality of conductive terminals 125 may be formed within the openings OP3 of the second redistribution layer 114. The conductive terminals 125 may be electrically connected with the conductive elements 114b of the second redistribution layer 114 through the openings OP3. As such, the conductive terminals 125 may be electrically connected with the semiconductor device 108 and the first redistribution layer 106 through the conductive wire segments 110'. In some embodiments, the conductive terminals 125 are electrically connected to the second redistribution layer 114 through under-ball metallurgy patterns. In another embodiment, the under-ball metallurgy patterns are omitted. In some embodiments, the conductive terminals 125 are, for example, solder balls or ball grid array (BGA) balls. In some embodiments, the conductive terminals 125 may be formed by performing a ball mounting and a reflow process.

Figure 1N:
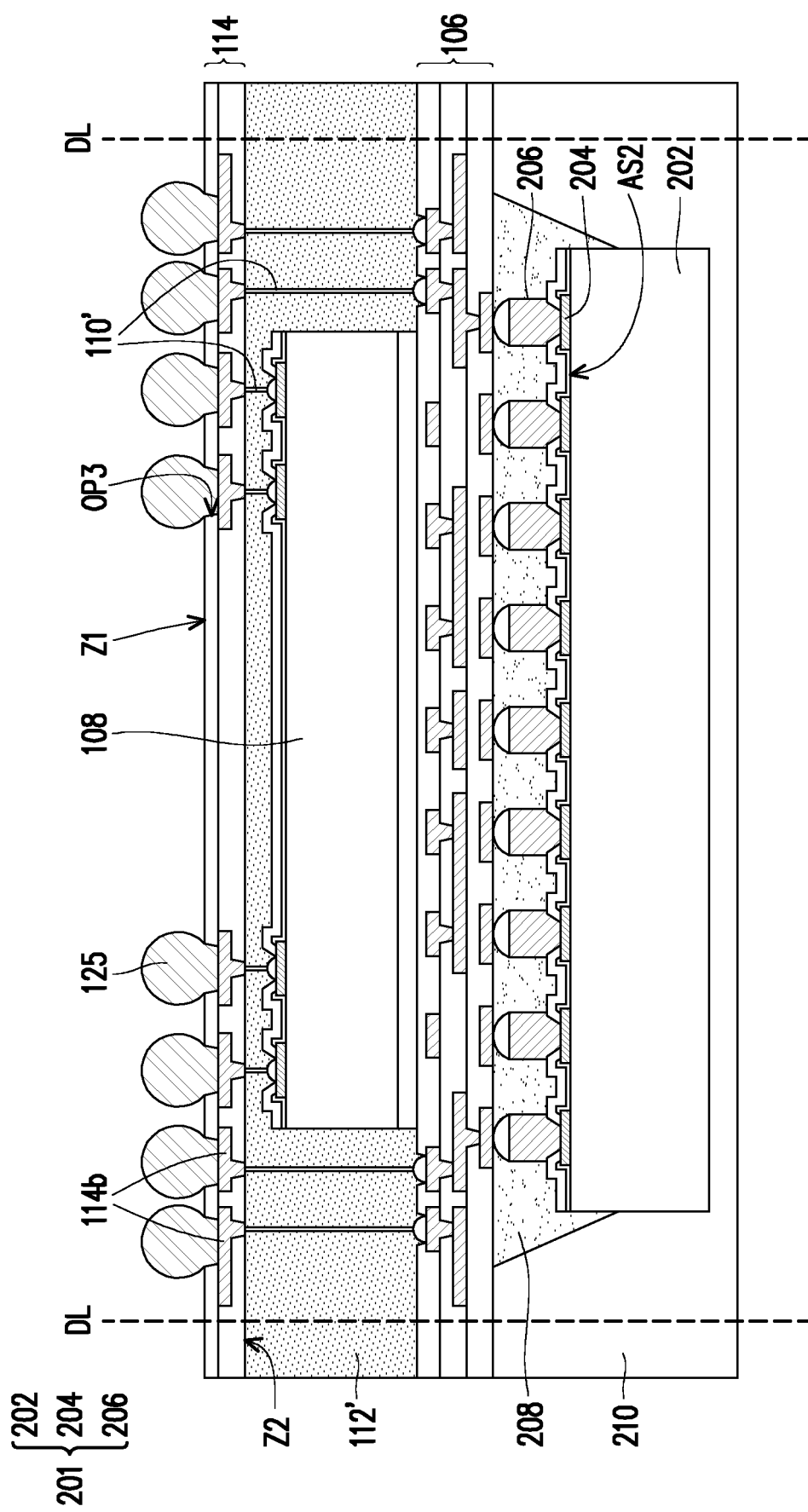
Figure 10:
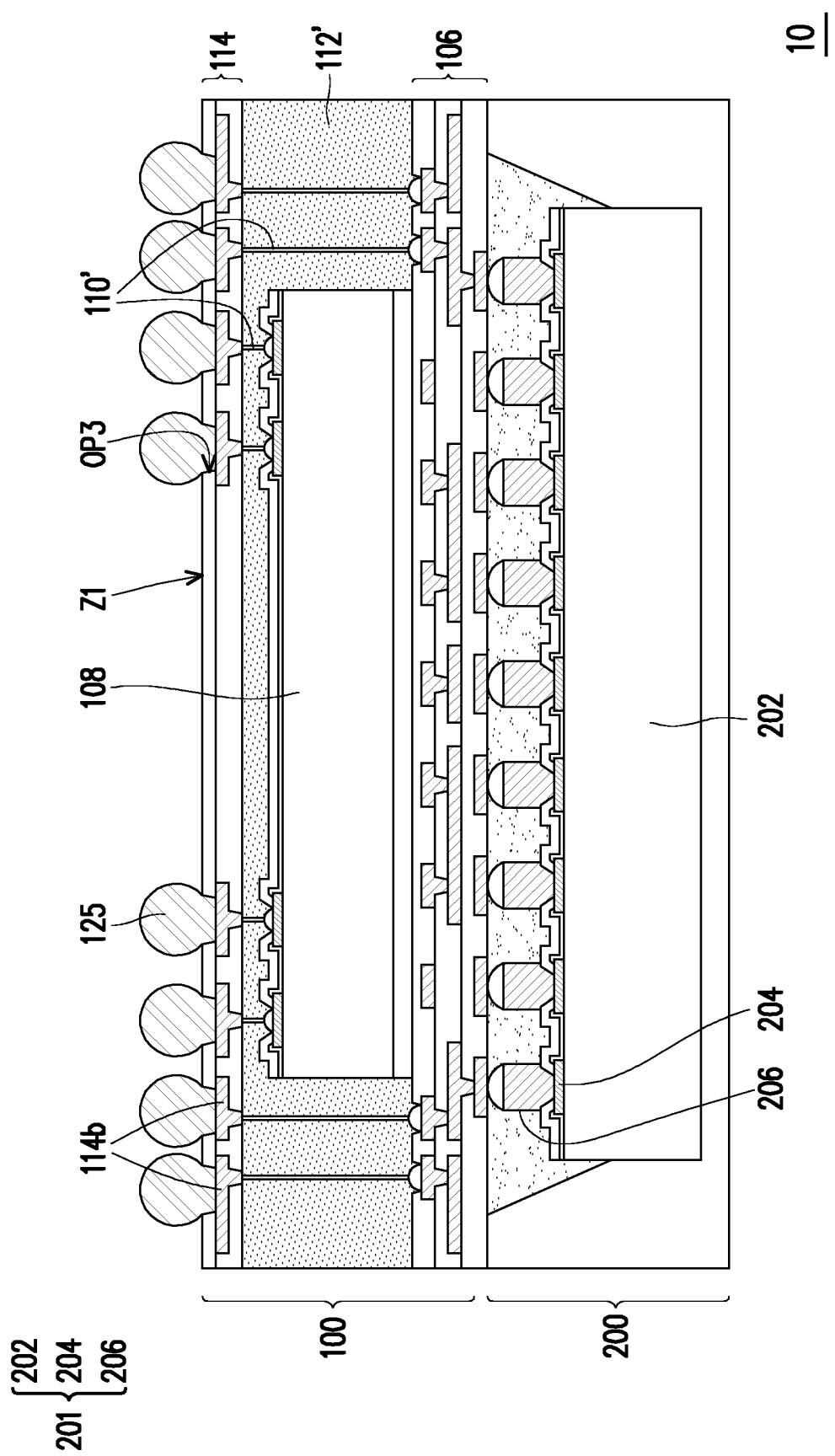

Subsequently, as shown in FIG. 1N, a dicing process or singulation process is performed along the dicing lines DL to cut the whole wafer/panel structure (cutting through the insulating encapsulant 112', the second insulating encapsulant 210, the first redistribution layer 106 and the second redistribution layer 114) into a plurality of packages. In the exemplary embodiment, the dicing process is a wafer dicing or a panel dicing process including mechanical blade sawing or laser cutting.

Referring to FIG. 1O, after the dicing process, individual package structure 10 is obtained. The package structure 10 is, for example, a package-on-package (PoP) structure. For instance, as shown in FIG. 1O, the package structure 10 includes at least a first package 100 and a second package 200. In the exemplary embodiment, the first package 100 includes a first redistribution layer 106, a semiconductor die 108, a second redistribution layer 114, a plurality of conductive wire segments 110', an insulating encapsulant 112' and a plurality of conductive terminals 125. The second package 200 includes a second semiconductor die 201 and a second insulating encapsulant 210 encapsulating the second semiconductor die 201, wherein the second package 200 is stacked on the second surface S2 of the first redistribution layer 106 and over the first package 100.

Figure 2:
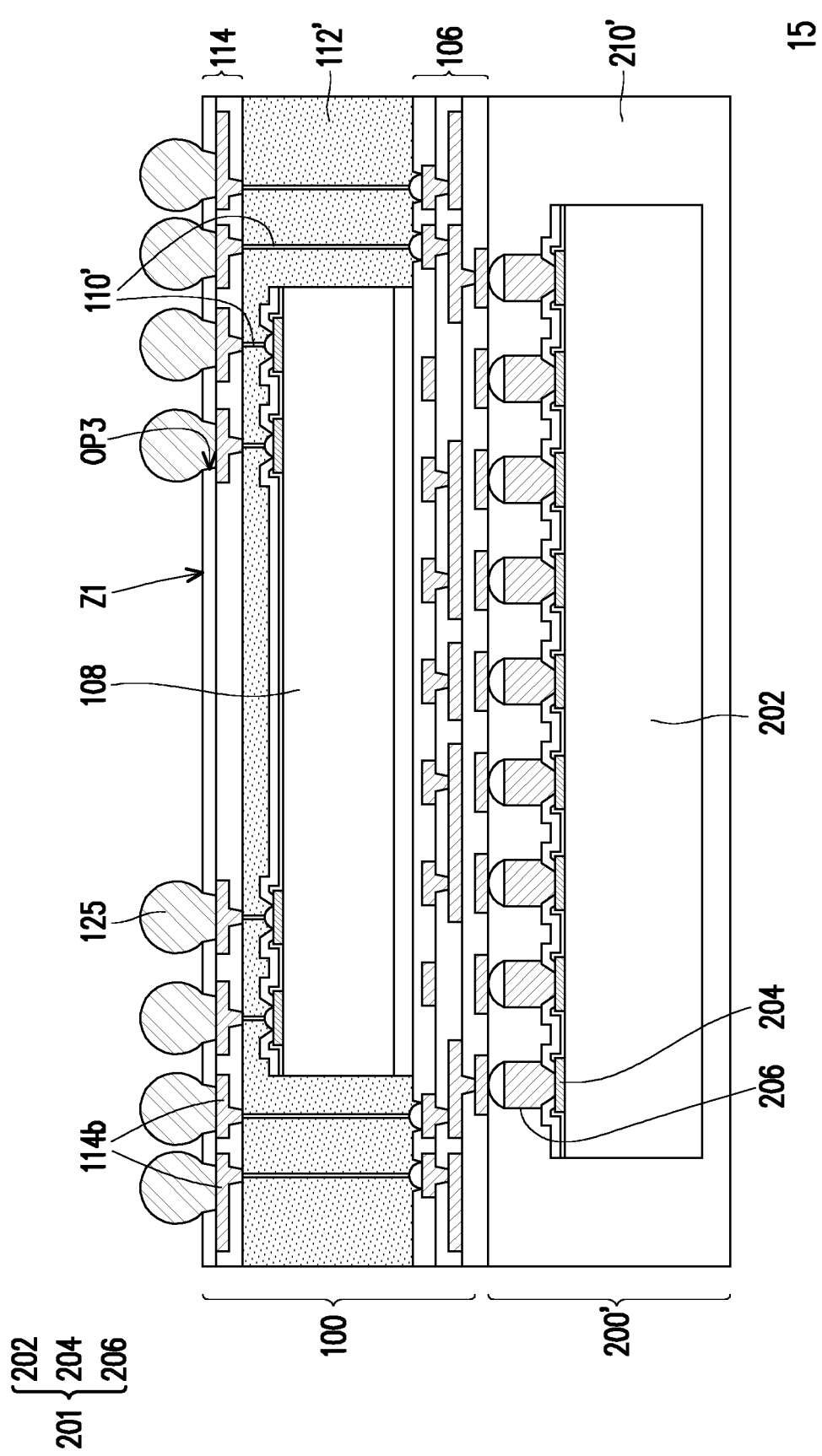
FIG. 2 is a schematic cross-sectional view of a package structure according to another embodiment of the present disclosure.

FIG. 2 is a schematic cross-sectional view of a package structure 15 according to another embodiment of the present disclosure. The package structure 15 of FIG. 2 is similar to the package structure 10 of FIG. 1O, hence, the same reference numerals are used to refer to the same or like parts, and its detailed description will be omitted herein. The package structure 15 of FIG. 2 differs from the package structure 10 of FIG. 1O, as no underfill is present in the second package 200' of FIG. 2. The package structure 15 may be produced following a similar process as described for the package structure 10 by omitting the steps of forming the underfill 208.

Figure 3:
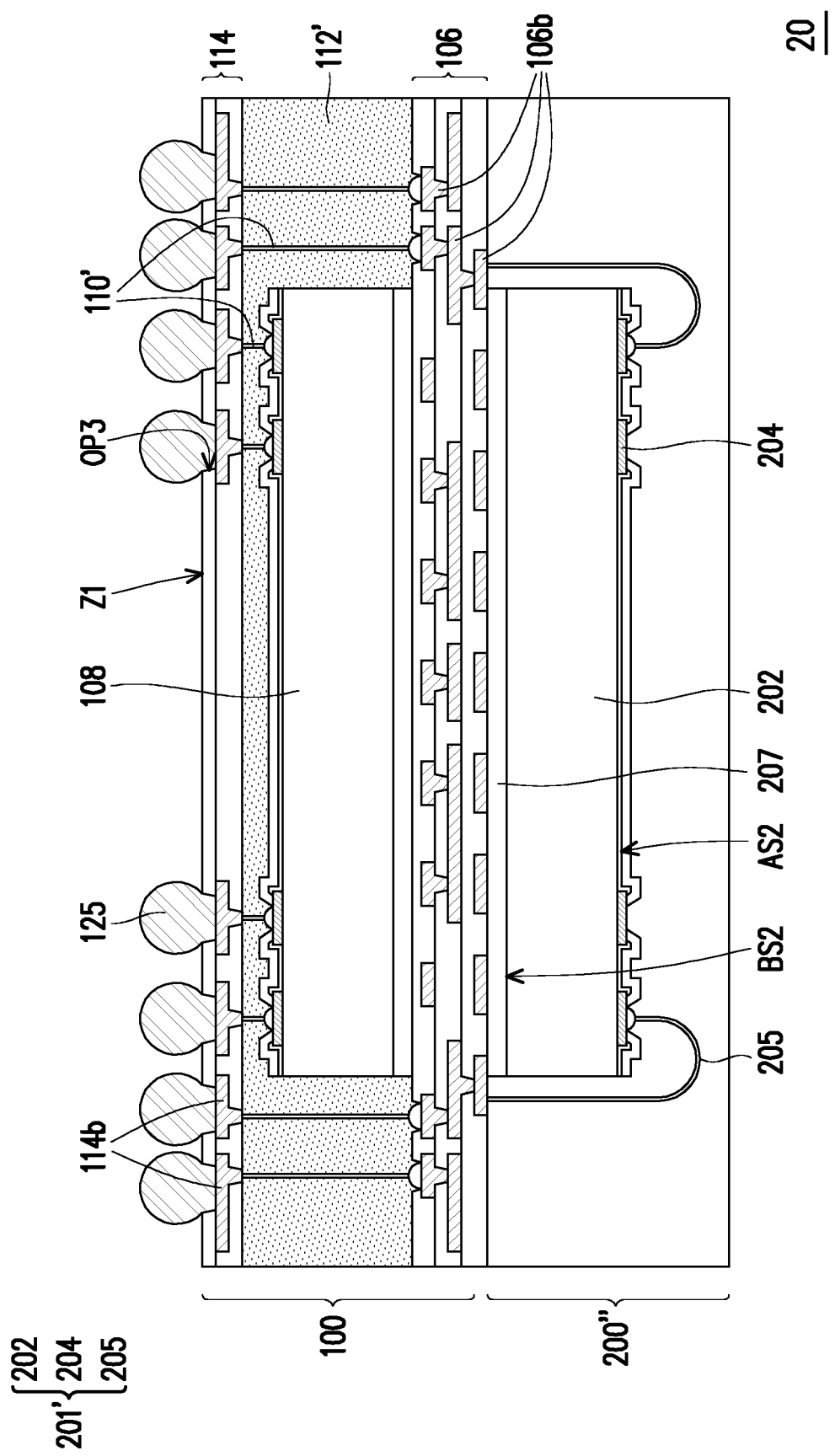
FIG. 3 is a schematic cross-sectional view of a package structure according to another embodiment of the present disclosure.

FIG. 3 is a schematic cross-sectional view of a package structure 20 according to another embodiment of the present disclosure. The package structure 20 of FIG. 3 is similar to the package structure 10 of FIG. 1O, hence, the same reference numerals are used to refer to the same or like parts, and its detailed description will be omitted herein. The package structure 20 of FIG. 3 differs from the package structure 10 of FIG. 1O in that the second semiconductor die 201' of the second package 200" is electrically connected to the first redistribution layer 106 of the first package 100 through wire bonding. That is, the active surface AS2 of the second semiconductor die 201' may face away from the first redistribution layer 106. In other words, the semiconductor die 201' may be disposed in a face-up configuration. An adhesive layer 207 may be interposed between a back-surface BS2 of the second semiconductor die 201' and the first redistribution layer 106. The electrical connection between the second semiconductor die 201' and the first redistribution layer 106 may be established through a plurality of conductive wires 205.

Based on the above, the package structure of the disclosure is formed with a plurality of conductive wire segments, wherein the conductive wire segments electrically connect the semiconductor die to the second redistribution layer, and electrically connect the first redistribution layer to the second redistribution layer. As such, the wire segments (formed through wire bonding) may be used to replace copper pillars/posts, copper bumps or through insulator vias (TIV) used in conventional package structures (or PoP structures) to provide vertical connection between the redistribution layers and to the semiconductor die. Overall, the simplicity of the manufacturing process of the package structure may be realized, thereby reducing the manufacturing cost.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
a first package, wherein the first package comprises:
a semiconductor die having an active surface and a back surface;
an insulating encapsulant encapsulating the semiconductor die and having a top surface and a bottom surface opposite to the top surface;
a first redistribution layer disposed on the back surface of the semiconductor die and the bottom surface of the insulating encapsulant, the first redistribution layer having a first surface and a second surface opposite to the first surface;
a second redistribution layer disposed on the active surface of the semiconductor die and having a third surface;
a plurality of first conductive wire segments, wherein each of the first conductive wire segments consisting of:
a first segment having a first extending direction substantially perpendicular to the third surface, the first segment being directly connected to the second redistribution layer; and
a first stud bonded to the semiconductor die, wherein the first stud is directly connected to the first segment;
a plurality of second conductive wire segments, wherein each of the second conductive wire segments consisting of:
a second segment having the first extending direction, the second segment being directly connected to the second redistribution layer; and
a second stud bonded to the first redistribution layer, wherein the second stud is directly connected to the second segment, wherein a terminal portion of the first segment, a terminal portion of the second segment, a top surface of the insulating encapsulant, and the third surface of the second redistribution layer are coplanar; and
a second package, stacked on the second surface of the first redistribution layer over the first package; wherein the first redistribution layer comprises:
a plurality of conductive elements; and
a dielectric layer, disposed on the plurality of conductive elements and having a plurality of openings to expose a portion of the plurality of conductive elements, wherein the plurality of second studs are embedded within the plurality of respective openings to be directly connected to the plurality of respective conductive elements.

2. The package structure according to claim 1, wherein a height of each of the second segments is in a range of 50 μm to 250 μm.

3. The package structure according to claim 1, wherein the insulating encapsulant is encapsulating the plurality of the first and the second conductive wire segments.

4. The package structure according to claim 1, wherein the second package comprises a second semiconductor die and a second insulating encapsulant encapsulating the second semiconductor die.

5. The package structure according to claim 4, wherein the second semiconductor die is electrically connected to the first redistribution layer of the first package through a plurality of conductive bumps, or through wire bonding.

6. The package structure according to claim 1, further comprising a plurality of conductive terminals disposed on the second redistribution layer and electrically connected to the second redistribution layer.

7. The package structure according to claim 1, further comprising:
an adhesive layer disposed between the first redistribution layer and the back surface of the semiconductor die, the adhesive layer having lateral sides encapsulated by the insulating encapsulant.

8. The package structure according to claim 1, wherein the terminal portion of the first segment only contact the third surface of the second redistribution layer, and the terminal portion of the second segment only contact the third surface of the second redistribution layer.

9. The package structure according to claim 1, wherein a sum of the number of the plurality of first conductive wire segments and the number of the plurality of second conductive wire segments is an even number.

* * * * *